United States Patent
Malinin

(10) Patent No.: US 8,681,514 B2
(45) Date of Patent: Mar. 25, 2014

(54) CONTROLLER FOR SECONDARY SIDE CONTROL OF A SWITCH, POWER CONVERTER, AND RELATED SYNCHRONOUS RECTIFICATION CONTROL METHOD

(75) Inventor: Andrey Malinin, Fort Collins, CO (US)

(73) Assignee: Integrated Device Technology, Inc., San Jose, CA (US)

( * ) Notice: Subject to any disclaimer, the term of this patent is extended or adjusted under 35 U.S.C. 154(b) by 367 days.

(21) Appl. No.: 12/987,943

(22) Filed: Jan. 10, 2011

(65) Prior Publication Data
US 2012/0176827 A1 Jul. 12, 2012

(51) Int. Cl.
H02M 3/335 (2006.01)
(52) U.S. Cl.
USPC .......................................... 363/21.14
(58) Field of Classification Search
USPC .......... 363/16.131, 127, 16, 17, 21.02, 21.06, 363/21.14
See application file for complete search history.

(56) References Cited

U.S. PATENT DOCUMENTS

| | | | |
|---|---|---|---|
| 5,442,534 A | 8/1995 | Cuk et al. | |
| 5,940,287 A | 8/1999 | Brkovic | |
| 6,353,544 B1 | 3/2002 | Lau | |
| 6,400,583 B1 | 6/2002 | Lau | |
| 7,599,198 B2 * | 10/2009 | Tao et al. | 363/17 |
| 8,077,481 B2 * | 12/2011 | Hua et al. | 363/15 |
| 2005/0041441 A1 | 2/2005 | Nagai et al. | |
| 2009/0097280 A1 * | 4/2009 | Wu et al. | 363/17 |
| 2010/0124086 A1 * | 5/2010 | Chen | 363/127 |

OTHER PUBLICATIONS

PCT International Search Report and Written Opinion of the International Searching Authority for PCT/US2012/020350, dated Aug. 7, 2012, 7 pages.
International Rectifier, "IR11672AS Advanced Smart Rectifier Control IC", www.irf.com, © 2009 International Rectifier, Nov. 2, 2009.
NCP4303A/B, "Secondary Side Synchronous Rectification Driver for High Efficiency SMPS Topologies", ON Semiconductor, http://onsemi.com, © Semiconductor Components Industries, LLC 2010, Publication Order No. NCP4303/D, Apr. 2010—Rev 1.

* cited by examiner

Primary Examiner — Nguyen Tran
(74) Attorney, Agent, or Firm — TraskBritt

(57) ABSTRACT

A controller, power converter, and a related method for secondary side control of a switch are disclosed herein. An embodiment of the present invention includes a controller. The controller comprises a drain to source voltage ($V_{DS}$ voltage) input configured to receive the $V_{DS}$ voltage of a transistor, a gate drive output configured to output a gate drive voltage to a gate of the transistor, and control logic configured to initiate a minimum on time signal independent of triggering the gate drive voltage to activate the transistor. A related method comprises comparing a $V_{DS}$ voltage of a transistor to a plurality of voltage threshold levels, driving a gate of the transistor when the $V_{DS}$ voltage crosses a predetermined voltage threshold, and asserting a minimum on time signal when the $V_{DS}$ voltage crosses another predetermined voltage threshold independent of driving the gate of the transistor.

20 Claims, 7 Drawing Sheets

CONTROLLER FOR SECONDARY SIDE CONTROL OF A SWITCH, POWER CONVERTER, AND RELATED SYNCHRONOUS RECTIFICATION CONTROL METHOD

TECHNICAL FIELD

Embodiments of the present disclosure relate generally to synchronous rectification control and, more particularly, to apparatuses and methods related to controlling a switch associated with the secondary side of a transformer in a power converter circuit.

BACKGROUND

High efficiency isolated power supplies often employ active switches that replace diodes and operate as synchronous rectifiers to improve efficiency of the power converter. Such power converters may include such switches the secondary side of a transformer. One approach for controlling the switches on the secondary side is to employ a secondary side controller.

FIG. 1 is a schematic of a power converter 100. The power converter 100 includes a primary side 101 and a secondary side 121 of a transformer 110. The primary side 101 includes a plurality of switches 102, 104. The secondary side 121 includes a plurality of switches 122, 124. The plurality of switches 102, 104 of the primary side 101, and the plurality of switches 122, 124 of the secondary side 121 may collectively be referred to as switches 102, 104, 122, 124. Each of the switches 102, 104, 122, 124 may be configured as a diode and a transistor coupled in parallel. The specific operation of the secondary side controllers 126, 128 will be discussed with reference to the operation waveforms of FIGS. 2A and 2B.

FIG. 2A is an operation waveform 200 of a conventional secondary side controller (e.g., secondary side controllers 126, 128 of FIG. 1). Drain to source voltage ($V_{DS}$ voltage) 210 represents the drain to source voltage of the transistor of the switch (e.g., switches 122, 124) on the secondary side 121. Drain to source current ($I_{DS}$ current) 220 represents the current flowing through the switch on the secondary side 121. Gate drive voltage 230 represents the voltage at the gate of the transistor of the switch driven by the secondary side controller. When the gate drive voltage 230 is low, $I_{DS}$ current 220 flows through the body diode. When the gate drive voltage 230 is high, $I_{DS}$ current 220 flows through the switch active area. The secondary side controllers may include internal control functions, such as "blanking time," which may be implemented as a signal such as a minimum on time 240 and a minimum off time 245, each of which is described below.

To activate (i.e., "turn on") the switch, the secondary side controller measures the $V_{DS}$ voltage 210 and compares the $V_{DS}$ voltage 210 with a predetermined threshold (i.e., "on threshold" 201), which often corresponds to the forward biased body diode voltage drop (e.g., −0.5V). To deactivate (i.e., "turn off") the switch, the secondary side controller measures the $V_{DS}$ voltage 210 and compares the $V_{DS}$ voltage 210 with another predetermined threshold (i.e., "off threshold" 202), which often corresponds to the on-state resistance voltage drop with zero current (e.g., 0V).

At the beginning of a power conversion cycle of the input voltage $V_{IN}$, the $V_{DS}$ voltage 210 may begin to drop. When the $V_{DS}$ voltage 210 crosses the on threshold 201, the secondary side controller asserts the gate drive voltage 230 in order to fully activate the switch. In resonant circuits, the $I_{DS}$ current 220 tends to rise slowly, which may cause the $V_{DS}$ voltage 210 to rise quickly. In some situations, the $V_{DS}$ voltage 210 may rise quickly to the off threshold 202 shortly after the switch is activated. If the $V_{DS}$ voltage 210 rises above the off threshold 202, the secondary side controller may deactivate the switch at the beginning of the power conversion cycle, which may be undesirable. In order to prevent the secondary side controller from deactivating the switch prematurely, the minimum on time 240 may be set and asserted such that the secondary side controller maintains the gate drive voltage 230 of the switch to be high for a minimum amount of time after the gate drive voltage 230 is asserted. In other words, triggering the minimum on time 240 and asserting the gate drive voltage 230 may be dependent upon each other, such as being triggered at the same time. During minimum on time 240, the comparator function of the secondary side controller may be disabled, and the gate drive voltage 230 remains high even if the $V_{DS}$ voltage 210 crosses the off threshold 202.

When the switch is deactivated (i.e., when the $V_{DS}$ voltage 210 crosses the off threshold 202), there may be a temporary sharp drop in the $V_{DS}$ voltage 210. Such a sharp drop may cause the $V_{DS}$ voltage 210 to drop below the on threshold 201. In order to avoid the switch from being activated at the end of the power conversion cycle, the minimum off time 245 may be set and asserted such that the secondary side controller maintains the gate drive voltage 230 of the switch to be low for a minimum amount of time after the gate drive voltage 230 is deasserted. While the minimum off time 245 is asserted, the comparator function of the secondary side controller may be temporarily disabled, and the gate drive voltage 230 remains low even if the $V_{DS}$ voltage 210 crosses the on threshold 201.

FIG. 2B is an operation waveform 250 of a conventional secondary side controller (e.g., secondary side controllers 126, 128 of FIG. 1) showing a potential failure situation. $V_{DS}$ voltage 210, gate drive voltage 230, and minimum on time 240 represent similar signals as those of FIG. 2A. Similarly, the on threshold 201 and the off threshold 202 may be similar to those of FIG. 2A. It is noted that $I_{DS}$ current 220 is not shown in FIG. 2B for simplicity. There may be situations in which the $V_{DS}$ voltage 210 may decrease relatively slowly over the entire power conversion cycle of the input voltage $V_{IN}$. Because of the $V_{DS}$ voltage 210 decreasing relatively slowly, the $V_{DS}$ voltage 210 may not reach the on threshold 201 for the first time until the end of the power conversion cycle. If the $V_{DS}$ voltage 210 eventually does cross the on threshold 201, the minimum on time 240 and the gate drive voltage 230 may be asserted. Because the minimum on time 240 in this situation has been asserted toward the end of the power conversion cycle, there is a possibility that the $V_{DS}$ voltage 210 increases to above the off threshold 202 before the minimum on time 240 has expired. Because the conventional secondary side controllers are configured to keep the gate drive voltage 230 asserted during the minimum on time 240, the crossing of the off threshold 202 may not be detected and the gate drive voltage 230 may remain activated at the end of the power conversion cycle when the switch is desired to be turned off. If the primary side voltage polarity has changed during this time, there may be cross-conduction between the primary side and the secondary side of the transformer, which may result in a system failure.

BRIEF SUMMARY

Embodiments of the present invention include a controller. The controller comprises a drain to source voltage ($V_{DS}$ voltage) input configured to receive the $V_{DS}$ voltage of a transistor, a gate drive output configured to output a gate drive voltage to a gate of the transistor, and control logic configured to initiate a minimum on time signal independent of triggering the gate drive voltage to activate the transistor.

Another embodiment of the present invention includes a method for controlling a switch configured to perform synchronous rectification. The method comprises comparing a drain to source voltage ($V_{DS}$ voltage) of a transistor to a plurality of voltage threshold levels, driving a gate of the transistor when the $V_{DS}$ voltage crosses a predetermined voltage threshold, and asserting a minimum on time signal when the $V_{DS}$ voltage crosses another predetermined voltage threshold independent of driving the gate of the transistor.

Yet another embodiment of the present invention includes a power converter. The power converter comprises a transformer configured to receive a voltage input signal on a primary side and transmit a voltage output signal on a secondary side, and at least one secondary side controller configured to initiate a minimum on time signal independent of triggering a gate drive voltage to activate at least one switch.

DETAILED DESCRIPTION

Figure 1:
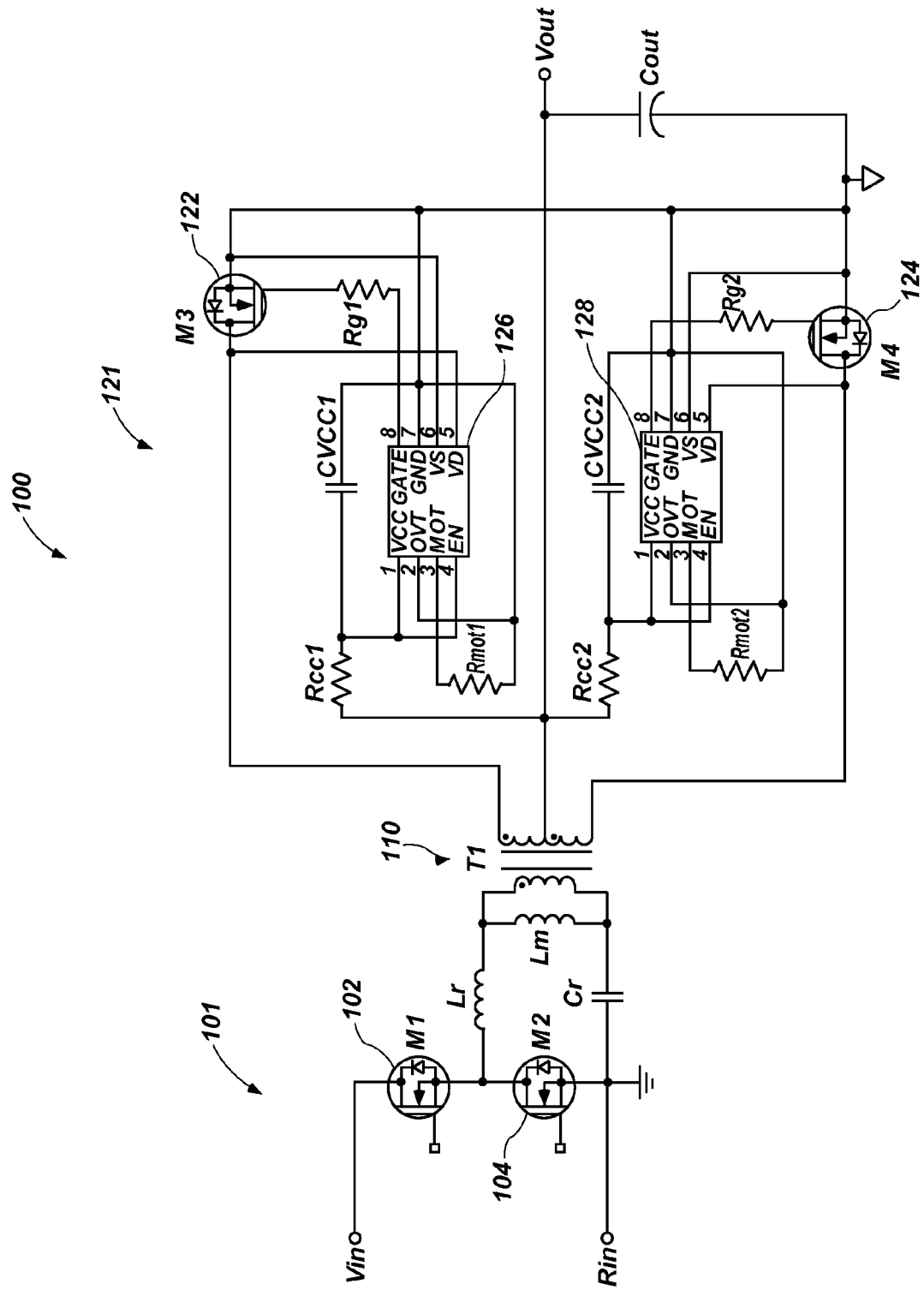
FIG. 1 is a schematic of a power converter.

In the following description, elements, circuits, and functions may be shown in block diagram form for ease of discussion and in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description of embodiments of the invention, reference is made to the accompanying drawings, which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense and the scope of the present invention is defined only by the appended claims.

Those of skill in the art understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate multiple signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

Those of skill in the art would further appreciate that the various illustrative logical blocks, modules, circuits, operations, and algorithm acts described in connection with embodiments disclosed herein may be implemented as electronic hardware, computer software, or combinations of both. To clearly illustrate this interchangeability of hardware and software, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the invention described herein.

The various illustrative logical blocks, modules, and circuits described in connection with the embodiments disclosed herein may be implemented or performed with a "controller" that may include a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Also, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise a set of elements may comprise one or more elements.

Figure 3:
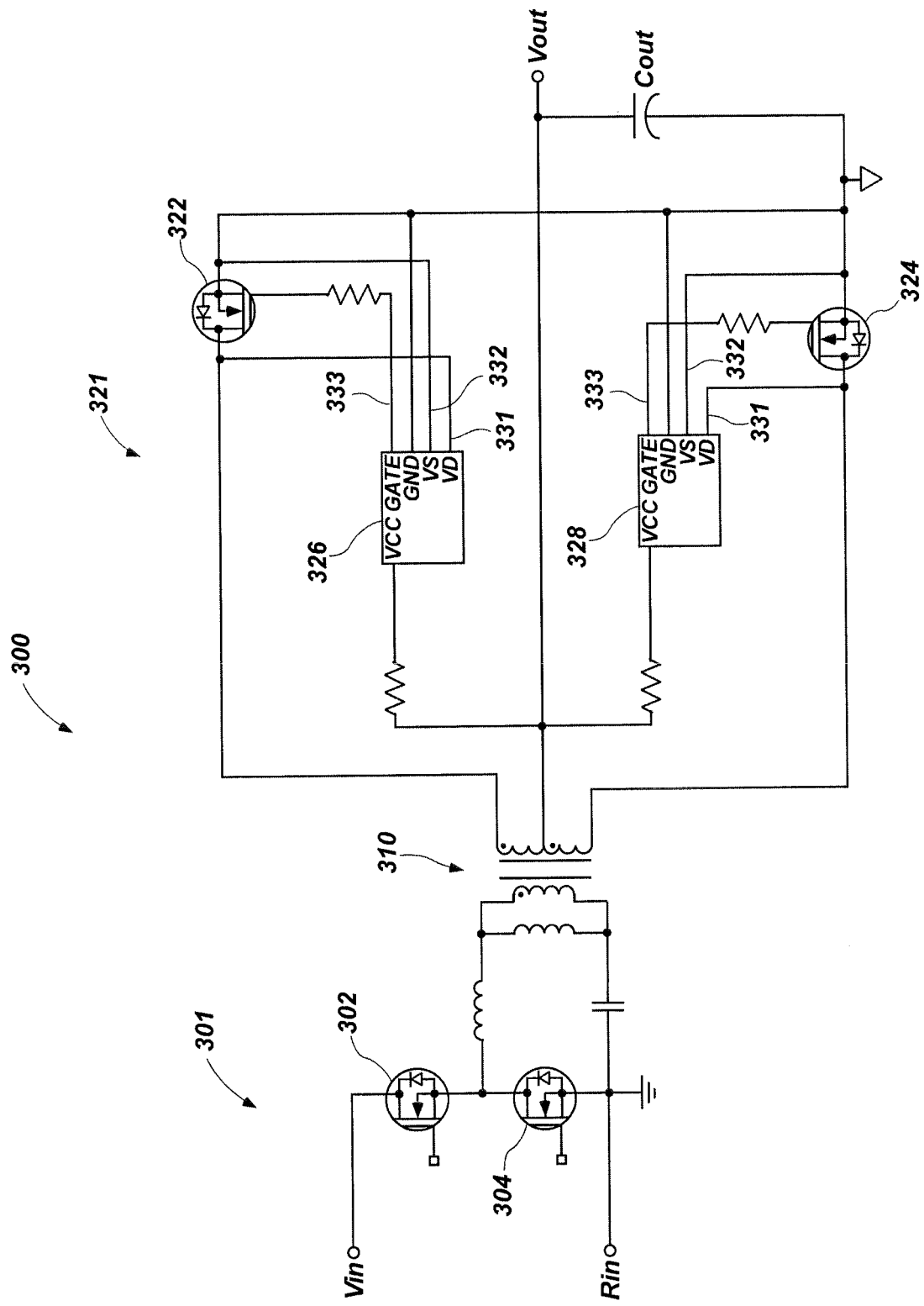
FIG. 3 is a schematic block diagram of a power converter according to an embodiment of the present disclosure.

FIG. 3 is a schematic block diagram of a power converter 300 according to an embodiment of the present disclosure. In operation, the input voltage $V_{IN}$ is received by the power converter 300 to be converted to an output voltage $V_{OUT}$. The input voltage $V_{IN}$ may be an alternating current (AC) signal while the output voltage $V_{OUT}$ may be a direct current (DC) signal. The voltage levels for the input voltage $V_{IN}$ and the output voltage $V_{OUT}$ may be different, in that the output voltage $V_{OUT}$ may be stepped up or stepped down from the input voltage $V_{IN}$.

The power converter 300 includes a primary side 301 and a secondary side 321 of a transformer 310. The primary side 301 includes a plurality of switches 302, 304. The secondary side 321 includes a plurality of switches 322, 324. The plurality of switches 302, 304 of the primary side 301, and the plurality of switches 322, 324 of the secondary side 321 may collectively be referred to as switches 302, 304, 322, 324. Each of the switches 302, 304, 322, 324 may be configured as a diode and a transistor coupled in parallel. The plurality of switches 302, 304 of the primary side 301 may operate as inverters. The plurality of switches 322, 324 on the secondary side 321 may be actively controlled and replace a diode, which configuration may provide synchronous rectification on the secondary side 321. As a result, the plurality of switches 322, 324 may be referred to as synchronous rectifiers.

While the power converter 300 is shown to be configured as a resonant half-bridge power converter, other power converter configurations are contemplated that include controllers that control the operation of one or more switches or other synchronous rectification circuitry. For example, embodiments of the present disclosure may be implemented in various power converter topologies, including a flyback converter, a forward converter, and other similar topologies in addition to resonant half bridge converters. In addition, the configuration of the resonant half-bridge converter in FIG. 3 illustrates that the output voltage $V_{OUT}$ is tapped at the center of the transformer 310; however, other configurations are also contemplated.

The transistor for a switch may be, for example, a MOSFET, BJT, or other appropriate device as known by those skilled in the art. The diode of a switch may be referred to as a "body diode." The switch may be activated (i.e., "turned on") by asserting a gate drive voltage causing current to flow through the switch. The switch may be deactivated (i.e., "turned off") by deasserting the gate drive voltage causing current to cease to flow through the switch. On the primary side 301, the plurality of switches 302, 304 may be controlled by control signals as are known by those of ordinary skill in the art. On the secondary side 321, the plurality of switches 322, 324 may be controlled by secondary side controllers 326, 328.

Each of the secondary side controllers 326, 328, include a $V_{DS}$ voltage input configured to receive the $V_{DS}$ voltage of the transistor of the corresponding switch 322, 324. For example, the $V_{DS}$ voltage input may include a first input 331 configured to receive a drain voltage of the transistor, and a second input 332 configured to receive a source voltage of the transistor. Each of the secondary side controllers 326, 328 may include a gate drive output 333 configured output a gate drive voltage to a gate of the transistor.

In particular, a first secondary side controller 326 controls the gate drive voltage of a first switch 322, and a second secondary side controller 328 controls the gate drive voltage of a second switch 324. While two secondary side controllers 326, 328 are shown in FIG. 3 to control the plurality of switches 322, 324, embodiments should not be limited to a particular number of components unless specifically described as requiring such. For example, an embodiment may include a single secondary side controller (not shown) that controls both switches 322, 324. In other embodiments, there may be more or fewer switches than are shown in FIG. 3 depending on the specific configuration of the power converter. For high current applications, it may be desirable to have a separate controller for each switch, which may permit control of the switch with floating source terminals.

Each of the secondary side controllers 326, 328 may be configured to initiate a minimum on time signal independent of triggering a gate drive voltage to activate at least one switch 322, 324. For example, each of the secondary side controllers 326, 328 may further include internal control logic configured to compare the $V_{DS}$ voltage of the transistor with a first threshold, activate a minimum on time signal when the $V_{DS}$ voltage crosses the first threshold, compare the $V_{DS}$ voltage with a second threshold that is different from the first threshold, and activate the gate drive output when the $V_{DS}$ voltage crosses the second threshold. Further operation of the secondary side controllers 326, 328 will be discussed with reference to the operation waveforms of FIGS. 4A and 4B.

Figure 4A:
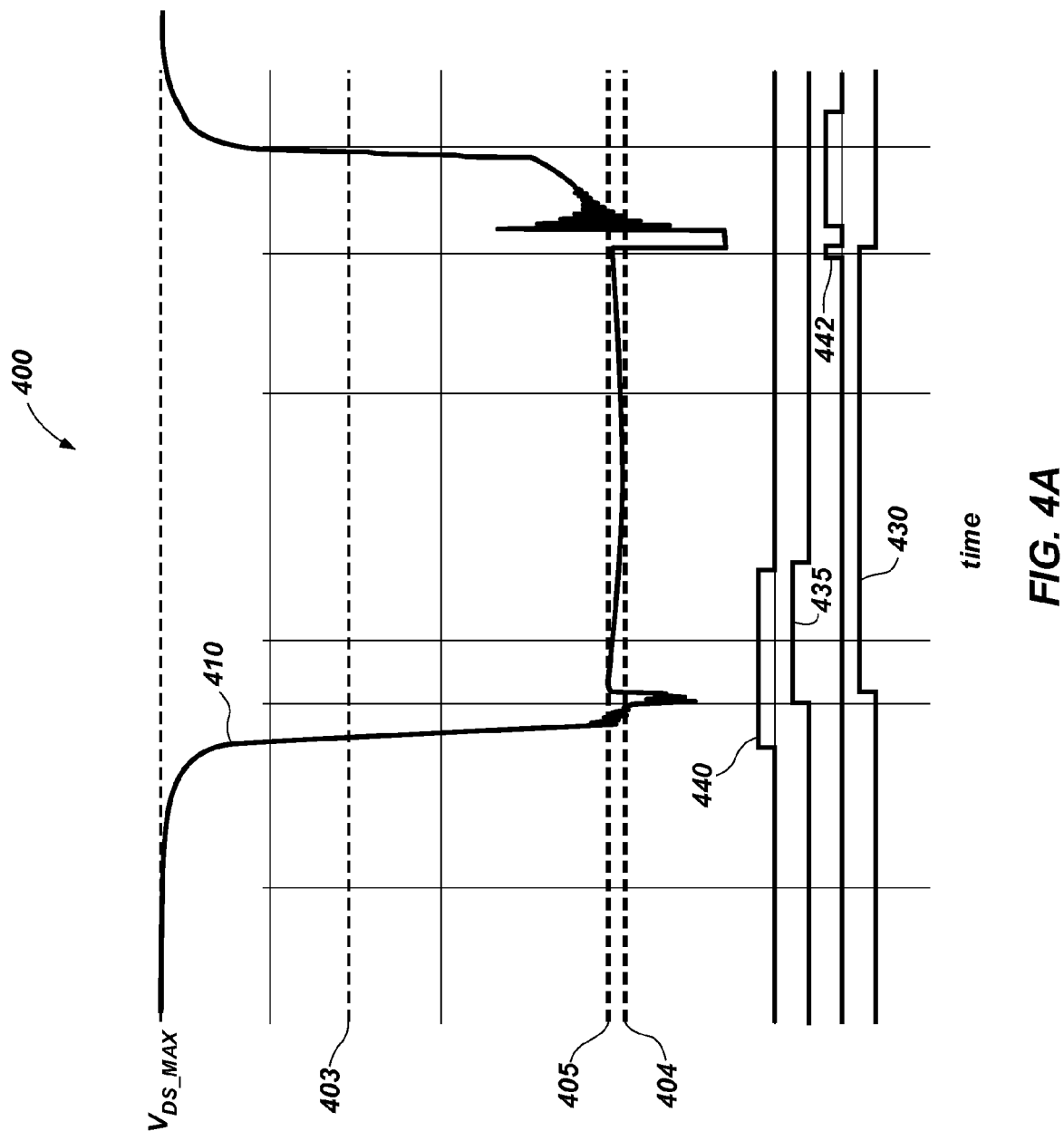
FIGS. 4A and 4B are operation waveforms of a secondary side controller according to an embodiment of the present disclosure.
Figure 4B:
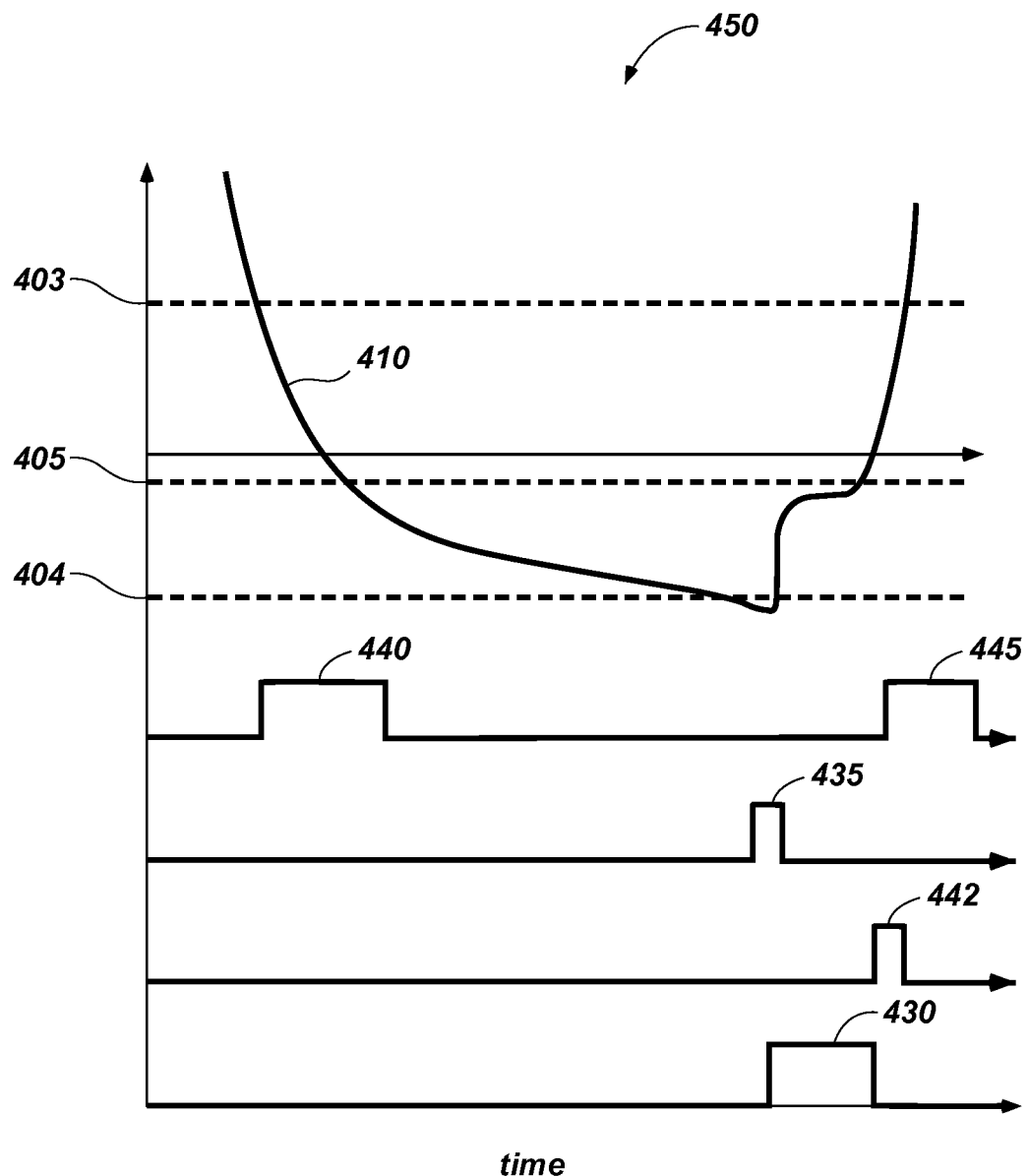

FIGS. 4A and 4B are operation waveforms 400, 450 of a secondary side controller (e.g., secondary side controllers 326, 328 of FIG. 3) according to an embodiment of the present disclosure. In particular, the operation waveform 400 of FIG. 4A may illustrate a normal operation of a $V_{DS}$ voltage 410, and the operation waveform 450 of FIG. 4B may illustrate a potential failure situation that may be avoided with the assistance of the embodiments of the present disclosure.

Referring still to FIGS. 4A and 4B, the $V_{DS}$ voltage 410 represents the drain-to-source voltage of the transistor of the switch (e.g., switch 322, 324 of FIG. 3). Gate drive voltage 430 represents the voltage at the gate of the transistor of the switch, which gate drive voltage 430 may be driven by the secondary side controller. The secondary side controllers may operate with "blanking time," which is represented by a minimum on time 440. The gate on pulse signal 435 represents an internal signal of the secondary side controller, the rising edge of which may trigger the activation of the gate drive voltage 430. The gate off pulse signal 442 represents an internal signal of the secondary side controller, the rising edge of which may trigger the deactivation of the gate drive voltage 430. In some situations, there may optionally be a minimum off time signal 445 (shown in FIG. 4B only). It is noted that $I_{DS}$ current (i.e., the current flowing through the body diode of the switch) is not shown in FIGS. 4A and 4B for simplicity.

To activate the minimum on time 440, the secondary side controller measures the $V_{DS}$ voltage 410 and compares the $V_{DS}$ voltage 410 with a first threshold (i.e., "minimum on time threshold" 403). To activate (i.e., "turn on") the switch, the secondary side controller measures the $V_{DS}$ voltage 410 and compares the $V_{DS}$ voltage 410 with a second threshold (i.e., "on threshold" 404). The minimum on time threshold 403 and the on threshold 404 are different voltage levels. The minimum on time threshold 403 may be a relatively more positive voltage, such as one-half of the maximum $V_{DS}$ voltage ($V_{DS\_MAX}$). To deactivate (i.e., "turn off") the switch, the secondary side controller measures the $V_{DS}$ voltage 410 and compares the $V_{DS}$ voltage 410 with a third predetermined threshold (i.e., "off threshold" 405).

Referring now specifically to FIG. 4A, the $V_{DS}$ voltage 410 may begin to drop during the first part of the power conversion cycle of the input voltage $V_{IN}$. In contrast with other secondary side controllers, there may be a minimum on time threshold 403 whereupon the minimum on time 440 may be asserted independent of asserting the gate drive voltage 430. If the $V_{DS}$ voltage 410 crosses the minimum on time threshold 403, the minimum on time 440 may be asserted for a predetermined duration.

The $V_{DS}$ voltage 410 may continue to drop, and may cross the on threshold 404 that determines the assertion of the gate on pulse 435. In response to the gate on pulse 435, the gate drive voltage 430 may be asserted and output to the gate of the switch. While the minimum on time 440 has not expired, the gate on pulse 435 may continue to be asserted and the gate off pulse 442 may be disabled. As a result, even if the $V_{DS}$ voltage 410 crosses the off threshold 405 while the minimum on time 440 is not expired, the gate drive voltage 430 may continue to be asserted. For example, while the minimum on time 440 is asserted, the comparator function of the secondary side controller may be temporarily disabled. In other words, during the minimum on time 440, the off threshold 405 may not be monitored, which may ensure that the gate drive voltage 430 is high on the gate drive output of the secondary side controller regardless of whether the $V_{DS}$ voltage 410 crosses the third threshold $V_{TH3}$.

At the end of the power conversion cycle, the $V_{DS}$ voltage 410 may rise and cross the off threshold 405 that determines the assertion of the gate off pulse 442. In response to the gate off pulse 442, the gate drive voltage 430 may cease to be asserted and is no longer output to the gate of the switch. It is noted that during this time that gate off pulse 442 was asserted, the minimum on time 440 has expired.

Because the minimum on time 440 is independent of activating the gate drive voltage 430, the on threshold 404 and the off threshold 405 may not need to have as much separation between them. In fact, the on threshold 404 and the off threshold 405 may be approximately the same. In other words, there may be a single threshold for both the on threshold 404 and the off threshold 405. In addition, it is noted that the on threshold 404 is required in conventional power converters to be lower (e.g., more negative) than the off threshold 405; however, in embodiments of the present disclosure, the off threshold 405 may be set to a predetermined value that is lower (e.g., more negative) than the on threshold 404.

Figure 2A:
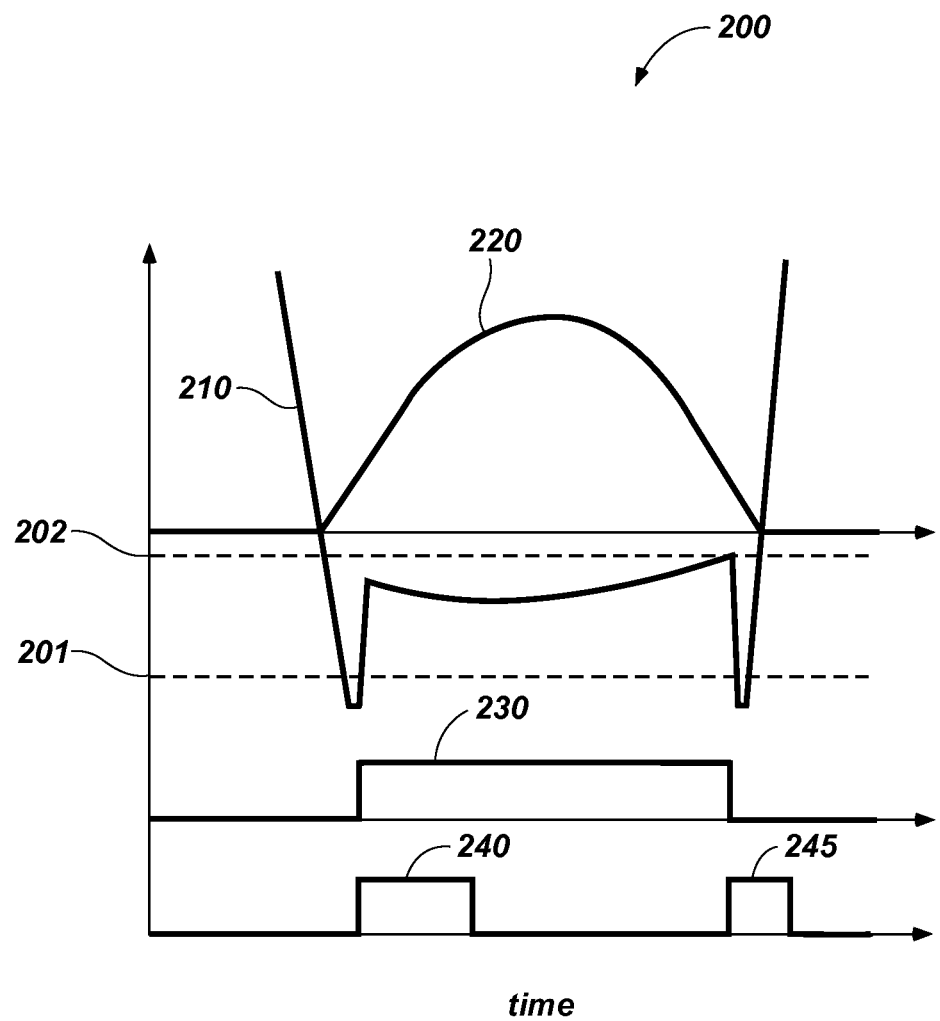
FIG. 2A is an operation waveform of a conventional secondary side controller.
Figure 2B:
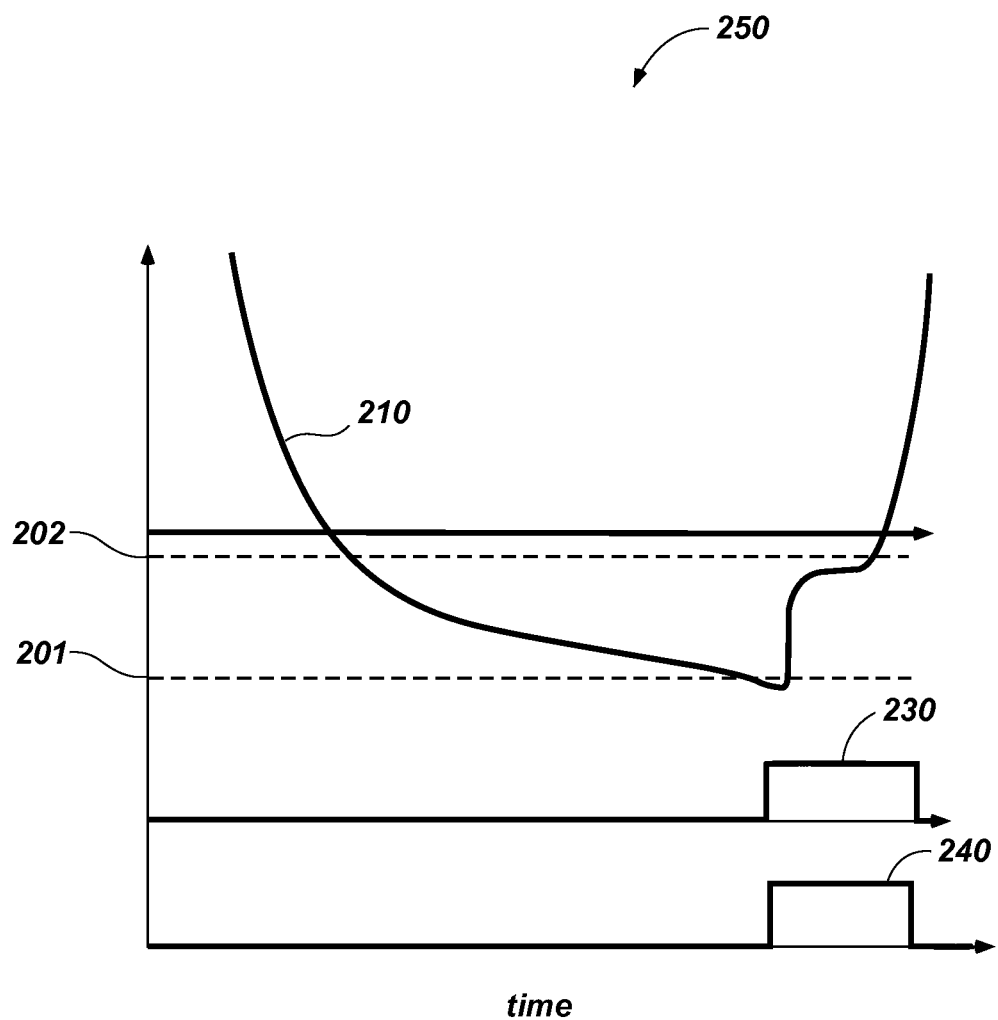
FIG. 2B is an operation waveform of a conventional secondary side controller showing a potential failure situation.

FIG. 4B is an operation waveform 450 of a secondary side controller (e.g., secondary side controllers 326, 328 of FIG. 3) according to an embodiment of the present disclosure. For example, the operation waveform 450 illustrates a scenario similar to the scenario illustrated by FIG. 2B, in that the $V_{DS}$ voltage 410 may decrease relatively slowly such that the $V_{DS}$ voltage 410 crosses the on threshold 404 toward the end of the power conversion cycle. For example, a relatively light load connected to the output voltage $V_{OUT}$ may be particularly susceptible to such a situation; however, other configurations may also experience this behavior of the $V_{DS}$ voltage 410.

As the $V_{DS}$ voltage 410 decreases relatively slowly, the $V_{DS}$ voltage 410 may cross the minimum on time threshold 403 still toward the beginning of the power conversion cycle, whereupon the minimum on time 440 may be asserted. In contrast to FIG. 4A, the minimum on time 440 expires before the $V_{DS}$ voltage 410 crosses the on threshold 404. As a result, if the $V_{DS}$ voltage 410 crosses the on threshold 404, the gate on pulse 435 is asserted along with the gate drive voltage 430 being output to the switch. Because the minimum on time 440 has expired, the gate off pulse 442 is not disabled and the off threshold 405 is still monitored. If the $V_{DS}$ voltage 410 crosses the off threshold 405, the gate off pulse 442 is asserted and the gate drive voltage 430 is turned off and ceases to be output to the switch. As a result, the possibility of the potential system failure related to cross-conduction caused by the minimum on time 440 being asserted at the end of the power conversion cycle may be reduced or eliminated. It is noted that when the gate off pulse 442 is asserted, the minimum off time 445 may be optionally asserted for a predetermined duration during which time the gate on pulse 435 may be disabled in the event that the $V_{DS}$ voltage 410 experiences a temporary drop below the on threshold 404.

Figure 5:
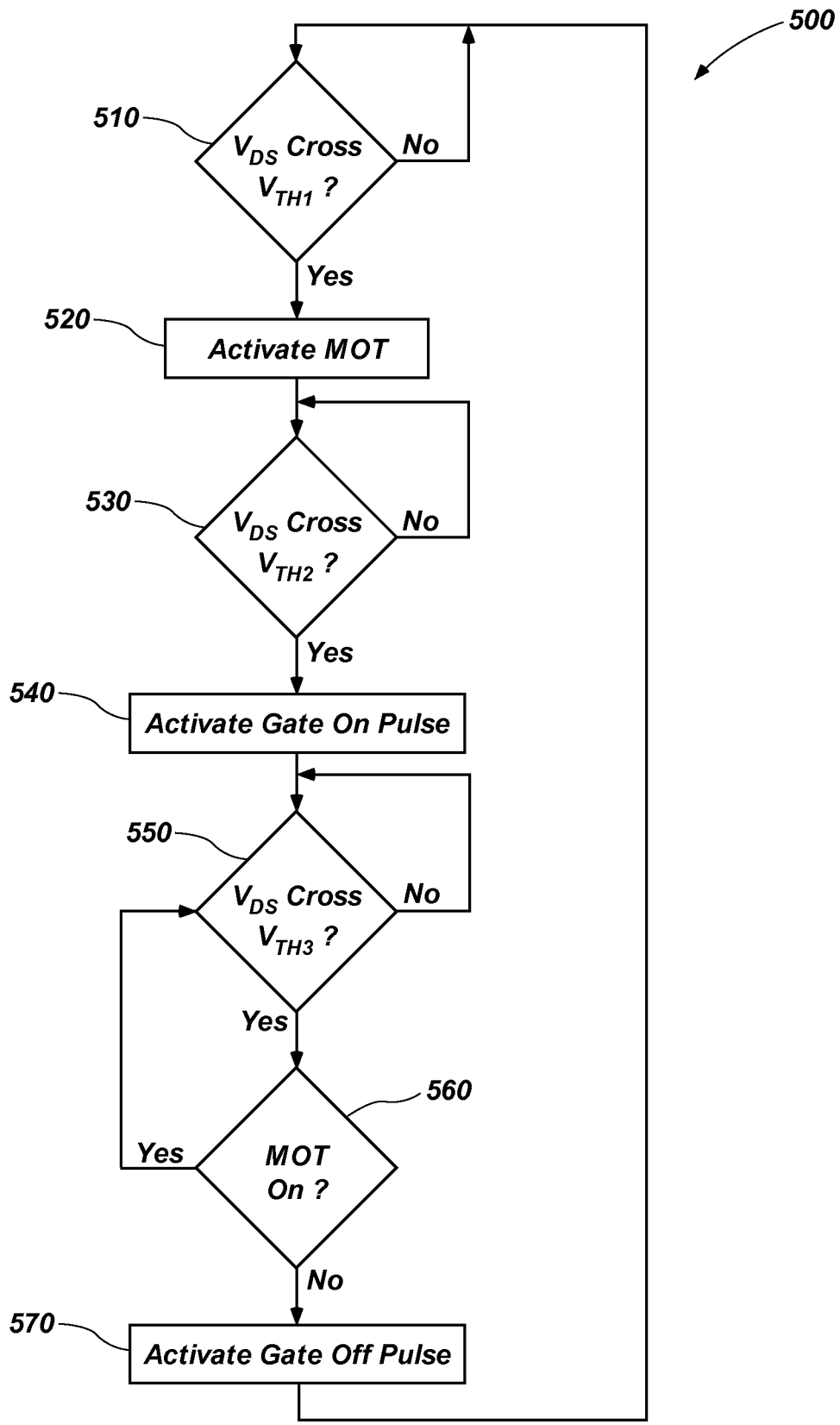
FIG. 5 is a flow chart illustrating a method of controlling a switch configured to perform synchronous rectification according to an embodiment of the present disclosure.

FIG. 5 is a flow chart 500 illustrating a method of controlling a switch configured to perform synchronous rectification according to an embodiment of the present disclosure. The switch may be implemented as one or more switch of a power converter (e.g., resonant half bridge, flyback, forward, etc.). The switch may include a transistor (e.g., MOSFET, BJT) coupled in parallel with a diode. Control of the switch may include driving a voltage on the gate according to events that are based, at least in part, on the drain to source voltage ($V_{DS}$ voltage) of the switch crossing one of a plurality of voltage thresholds according to the various embodiments of the present disclosure.

At operation 510, it is determined whether the $V_{DS}$ voltage crosses a first threshold $V_{TH1}$. Crossing the first threshold $V_{TH1}$ refers to the $V_{DS}$ voltage crossing the first threshold $V_{TH1}$ from a voltage above the first threshold $V_{TH1}$ to a voltage below the first threshold $V_{TH1}$. The first threshold $V_{TH1}$ may be a predetermined threshold set to trigger the minimum on time of the output of the controller. The first $V_{TH1}$ may be a voltage between the maximum $V_{DS}$ voltage and the second threshold $V_{TH2}$, which will be described below. For example, the first threshold $V_{TH1}$ may be a threshold that is approximately one-half of the maximum $V_{DS}$ voltage. If the $V_{DS}$ voltage has not crossed the first threshold $V_{TH1}$, the $V_{DS}$ voltage continues to be monitored against the first threshold $V_{TH1}$. If the $V_{DS}$ voltage crosses the first threshold $V_{TH1}$, the minimum on time (MOT) may be activated at operation 520. Thus, the first threshold $V_{TH1}$ may be considered the minimum on time threshold. The minimum on time runs concurrently with the other operations until a predetermined duration for the minimum on time has expired. During the minimum on time, it may be ensured that the gate off pulse is not asserted. As a result, during the minimum on time, the gate off pulse may be disabled.

At operation 530, it is determined whether the $V_{DS}$ voltage crosses a second threshold $V_{TH2}$. Crossing the second threshold $V_{TH2}$ refers to the $V_{DS}$ voltage crossing the second threshold $V_{TH2}$ from a voltage above the second threshold $V_{TH2}$ to a voltage below the second threshold $V_{TH2}$. The second threshold $V_{TH2}$ may be a predetermined threshold set to trigger the gate on pulse within the controller. The second threshold $V_{TH2}$ may be a voltage below the first threshold $V_{TH1}$. For example, the second threshold $V_{TH2}$ may be approximately at or below 0V. If the $V_{DS}$ voltage has not crossed the second threshold $V_{TH2}$, the $V_{DS}$ voltage continues to be monitored against the second threshold $V_{TH2}$. If the $V_{DS}$ voltage crosses the second threshold $V_{TH2}$, the gate on pulse may be activated at operation 540. The gate on pulse may be a pulse within the controller that is used to activate the gate drive voltage output from the controller. For example, the rising edge of the gate on pulse may activate the gate drive voltage that is output from the controller in order to activate (i.e., turn on) the switch. Thus, the second threshold $V_{TH2}$ may be considered the on threshold.

At operation 550, the $V_{DS}$ voltage may be monitored to determine whether the $V_{DS}$ voltage crosses a third threshold $V_{TH3}$. Crossing the third threshold $V_{TH3}$ refers to the $V_{DS}$ voltage crossing the third threshold $V_{TH3}$ from a voltage below the third threshold $V_{TH3}$ to a voltage above the second threshold $V_{TH2}$. If the third threshold $V_{TH3}$ is not crossed, then the $V_{DS}$ voltage may continue to be monitored. If the third threshold $V_{TH3}$ is crossed, then it may be determined whether the minimum on time is still on at operation 560. As previously discussed, the minimum on time is asserted for a predetermined duration, during which the gate on pulse may be activated and during which the gate off pulse may not be activated (i.e., gate off pulse may be disabled). If the minimum on time is still on, then the minimum on time may continue to be monitored until the minimum on time expires. In some embodiments, operation 550 may also be repeated and the status of the $V_{DS}$ voltage may also be compared against the third threshold 560 to determine whether the $V_{DS}$ voltage is still greater than the third threshold $V_{TH3}$.

If the minimum on time has expired, the gate off pulse may be activated at operation 570. The gate off pulse may be a pulse within the controller that is used to deactivate the gate drive voltage that is output of the controller. For example, the rising edge of the gate off pulse may deactivate the gate drive voltage that is output from the controller in order to deactivate (i.e., turn off) the switch. Thus, the third threshold $V_{TH3}$ may be considered the off threshold. With the $V_{DS}$ voltage returning to the maximum $V_{DS}$ voltage, a power conversion cycle of the power converter may be completed, and the method may return to operation 510 to monitor the $V_{DS}$ voltage for crossing the first voltage threshold $V_{TH1}$.

While the flow chart 500 illustrates operations as being performed in a particular order, other variations may exist that will be apparent to one of ordinary skill in the art. For example, in some embodiments, monitoring the expiration of minimum on time during operation 560 may occur prior to monitoring the $V_{DS}$ voltage for crossing the third threshold $V_{TH3}$.

While the present invention has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A controller, comprising:
    a drain to source voltage ($V_{DS}$ voltage) input configured to receive the $V_{DS}$ voltage of a transistor;
    a gate drive output configured to output a gate drive voltage to a gate of the transistor; and
    control logic configured to initiate a minimum on time signal independent of triggering the gate drive voltage to activate the transistor, wherein the minimum on time signal represents a predetermined amount of time such that the gate drive voltage remains on for a remainder of the predetermined amount of time if the gate drive voltage is triggered while the minimum on time signal is asserted.

2. The controller of claim 1, wherein the control logic is further configured to:
    compare the $V_{DS}$ voltage of the transistor with a first threshold;
    activate the minimum on time signal responsive to the $V_{DS}$ voltage crossing the first threshold;
    compare the $V_{DS}$ voltage with a second threshold that is different from the first threshold; and
    activate the gate drive output responsive to the $V_{DS}$ voltage crossing the second threshold.

3. The controller of claim 1, wherein the first threshold is set at a positive voltage level.

4. The controller of claim 1, wherein the first threshold is set at a voltage level that is approximately one-half of a maximum $V_{DS}$ voltage level.

5. The controller of claim 2, wherein the control logic is further configured to:
    compare the $V_{DS}$ voltage of the transistor with a third threshold; and
    deactivate the gate drive output responsive to the $V_{DS}$ crossing the third threshold.

6. The controller of claim 5, wherein the third threshold and the second threshold are set at a different voltage level.

7. The controller of claim 5, wherein the second threshold is a negative voltage.

8. A method for controlling a switch configured to perform synchronous rectification, the method comprising:
    comparing a drain to source voltage ($V_{DS}$ voltage) of a transistor to a plurality of voltage threshold levels;
    asserting a minimum on time signal responsive the $V_{DS}$ voltage crosses a first predetermined voltage threshold, the minimum on time signal having a predetermined duration; and
    driving a gate of the transistor responsive to the $V_{DS}$ voltage crossing a second predetermined voltage threshold, wherein driving the gate continues to be performed at least while the minimum on time signal is asserted.

9. The method of claim 8, wherein asserting the minimum on time signal occurs responsive to the $V_{DS}$ voltage crossing the first predetermined threshold of approximately one-half of a maximum voltage of the $V_{DS}$ voltage.

10. The method of claim 8, wherein asserting the minimum on time signal is initiated prior to initiating driving the gate of the transistor.

11. The method of claim 8, wherein asserting the minimum on time signal occurs in a first half of a power conversion cycle and driving the gate of the transistor occurs in a second half of the power conversion cycle.

12. The method of claim 8, further comprising ceasing to drive the gate of the transistor responsive to the $V_{DS}$ voltage crossing a third predetermined threshold.

13. The method of claim 12, wherein driving a gate of the transistor occurs responsive to the $V_{DS}$ voltage crossing the second predetermined voltage threshold from a high voltage to a low voltage, and ceasing to drive the gate of the transistor occurs responsive to the $V_{DS}$ voltage crosses the third predetermined threshold from a low voltage to a high voltage.

14. A power converter, comprising:
    a transformer configured to receive a voltage input signal on a primary side and transmit a voltage output signal on a secondary side; and
    at least one secondary side controller configured to initiate a minimum on time signal independent of triggering a gate drive voltage to activate at least one switch, the gate drive voltage remaining active at least during a remainder of a predetermined duration for the minimum on time signal if the gate drive voltage is triggered prior to expiration of the minimum on time signal.

15. The power converter of claim 14, wherein circuit components of the primary side and the secondary side are configured according to a resonant half bridge converter topology.

16. The power converter of claim 14, wherein circuit components of the primary side and the secondary side are configured according to at least one of a flyback converter and a forward converter topology.

17. The power converter of claim 14, wherein the at least one secondary side controller comprises a plurality of secondary side controllers, and the at least one switch comprises a plurality of switches.

18. The power converter of claim 17, wherein each of the plurality of secondary side controllers is coupled to a corresponding one of the plurality of switches.

19. The controller of claim 1, wherein the control logic is further configured to initiate trigger the gate drive voltage to activate the transistor after the minimum on time signal is deasserted if the predetermined amount of time expires prior to the $V_{DS}$ voltage crossing the second predetermined threshold.

20. The method of claim 12, wherein driving the gate of the transistor continues to be performed after the predetermined amount of time for the minimum on time signal is expired until ceasing to drive the gate of the transistor responsive to the $V_{DS}$ voltage crossing the third predetermined threshold.

* * * * *